(12) United States Patent
Chaney et al.

(10) Patent No.: US 6,816,349 B1
(45) Date of Patent: Nov. 9, 2004

(54) INTEGRATED POWER SWITCH WITH CURRENT LIMIT CONTROL AND A METHOD OF USE

(75) Inventors: Steve Chaney, San Jose, CA (US); Bruce Hennig, Pleasanton, CA (US)

(73) Assignee: Micrel, Inc., San Jose, CA (US)

( * ) Notice: Subject to any disclaimer, the term of this patent is extended or adjusted under 35 U.S.C. 154(b) by 171 days.

(21) Appl. No.: 10/185,606

(22) Filed: Jun. 27, 2002

(51) Int. Cl.[7] .............................. H02H 3/08; H02H 9/02
(52) U.S. Cl. ........................................ 361/57; 361/87
(58) Field of Search .......................... 361/57, 93.7, 87; 327/277; 323/277, 276, 280

(56) References Cited

U.S. PATENT DOCUMENTS

| | | | | |
|---|---|---|---|---|
| 4,750,079 A | * | 6/1988 | Fay et al. .................... 361/101 |
| 5,004,970 A | * | 4/1991 | Barou ......................... 323/277 |
| 5,325,258 A | * | 6/1994 | Choi et al. ..................... 361/87 |
| 5,422,593 A | * | 6/1995 | Fujihira ........................ 327/561 |
| 6,456,155 B2 | * | 9/2002 | Takai .......................... 327/541 |

\* cited by examiner

Primary Examiner—Brian Sircus
Assistant Examiner—Z Kitov
(74) Attorney, Agent, or Firm—Sawyer Law Group LLP

(57) ABSTRACT

An integrated power switch is disclosed. The power switch comprises a power transistor for providing an output current. The power transistor includes a grounded body. The power switch includes a sense transistor coupled to the power transistor. The sense transistor includes a floating body. The power switch further includes a resistor coupled to the floating body of the sense transistor. A value of the resistor is chosen such that the output current is regulated at a predetermined level. Accordingly, a power switch in accordance with the present invention includes a power transistor which is implemented with grounded body and its companion sense transistor is implemented with floating body. Higher operating voltages can be achieved by turning on the parasitic transistor inside the sense transistor with a resistor connected from its body to ground. The impact ionization current of the power and sense transistors are included in the current limit loop control. The operating voltage and current range of an integrated power switch is extended by including the effect of impact ionization current in the current limit control loop.

8 Claims, 7 Drawing Sheets

INTEGRATED POWER SWITCH WITH CURRENT LIMIT CONTROL AND A METHOD OF USE

FIELD OF THE INVENTION

The present invention relates generally to integrated power switches and more particularly to a method and system for providing accuracy for such switches in current limited applications.

BACKGROUND OF THE INVENTION

Large integrated power MOS transistors are used to switch power from a source to a load in many circuits. For the protection of the switch itself and the load some form of current limiting technique is deployed. The aim of this current limit is not to let the load current to increase above a fixed or user adjusted value. All conventional circuits achieve this goal with a serious limitation. Above a certain input voltage in dead-short condition the output current unexpectedly increases to dangerous levels due to impact ionization inside the power transistor.

Accordingly, what is needed is a system and method that overcomes this problem. The system and method should be easy to implement, cost effective and adaptable to existing integrated circuit devices. The present invention addresses such a need.

SUMMARY OF THE INVENTION

An integrated power switch is disclosed. The power switch comprises a power transistor for providing an output current. The power transistor includes a grounded body. The power switch includes a sense transistor coupled to the power transistor. The sense transistor includes a floating body. The power switch further includes a resistor coupled to the floating body of the sense transistor. A value of the resistor is chosen such that the output current is regulated at a predetermined level.

Accordingly, a power switch in accordance with the present invention includes a power transistor which is implemented with grounded body and its companion sense transistor is implemented with floating body. Higher operating voltages can be achieved by turning on the parasitic transistor inside the sense transistor with a resistor connected from its body to ground. The impact ionization current of the power and sense transistors are included in the current limit loop control. The operating voltage and current range of an integrated power switch is extended by including the effect of impact ionization current in the current limit control loop.

DETAILED DESCRIPTION

The present invention relates generally to integrated power switches and more particularly to a method and system for providing accuracy for such switches in current limited applications. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the to present invention is not intended to be limited to the embodiment shown but is to be accorded the widest scope consistent with the principles and features described herein.

Figure 1:
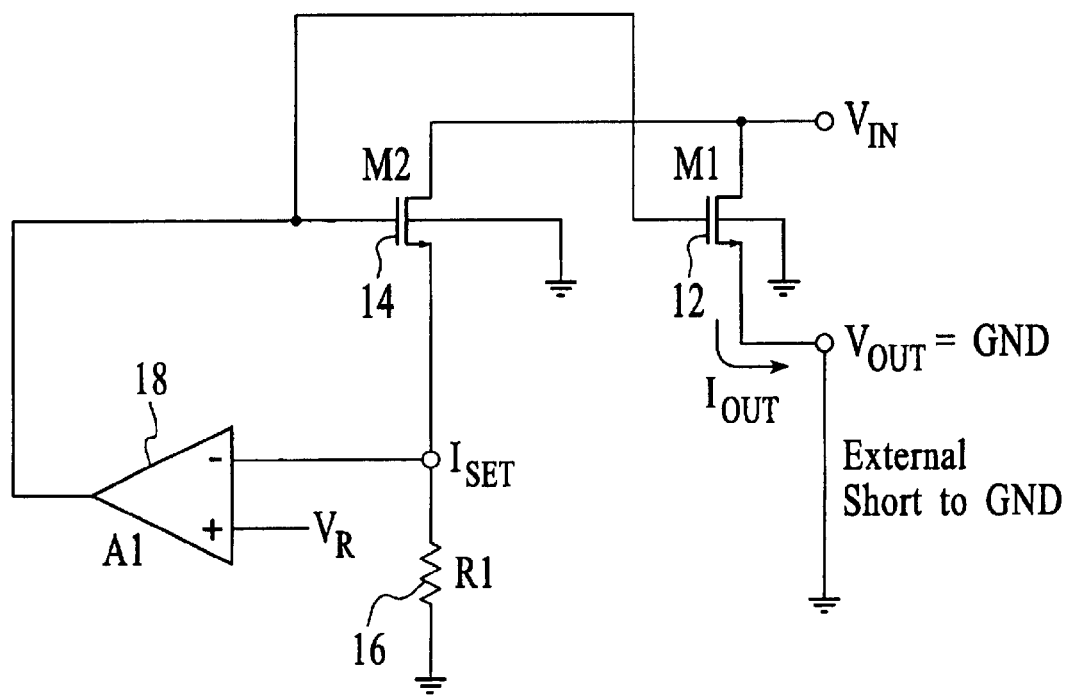
FIG. 1 is a diagram of a conventional integrated power switch which utilizes N-channel power transistors.

FIG. 1 is a diagram of a conventional integrated power switch 10 which utilizes N-channel power transistors. One of ordinary skill in the art easily can convert this circuit using P-channel transistors and all the following claims would apply with the appropriate conversion. The schematic of FIG. 1 shows the power switch 10 with output already shorted to ground. Only those components are shown which are involved with the current limit. Other elements of the power switch are omitted in this discussion. Transistor 12 is the main power transistor and transistor 14 is the sense transistor. They have common drain and common gate. The area ratio of transistor 12 and transistor 14 is referred to as AR. The current transfer ratio from transistor 14 to transistor 12 is also referred to as AR as well. As is seen, amplifier 18 receives an $I_{set}$ current from the sense transistor and a reference voltage and feeds back a comparison to the gates of transistors 12 and 14. The output current ($I_{out}$) is described by the following formula, $I_{out}=AR*V_r/R_1$, where $V_r$ is a reference voltage and $R_1$ is the current limit set resistor 16.

Figure 2:
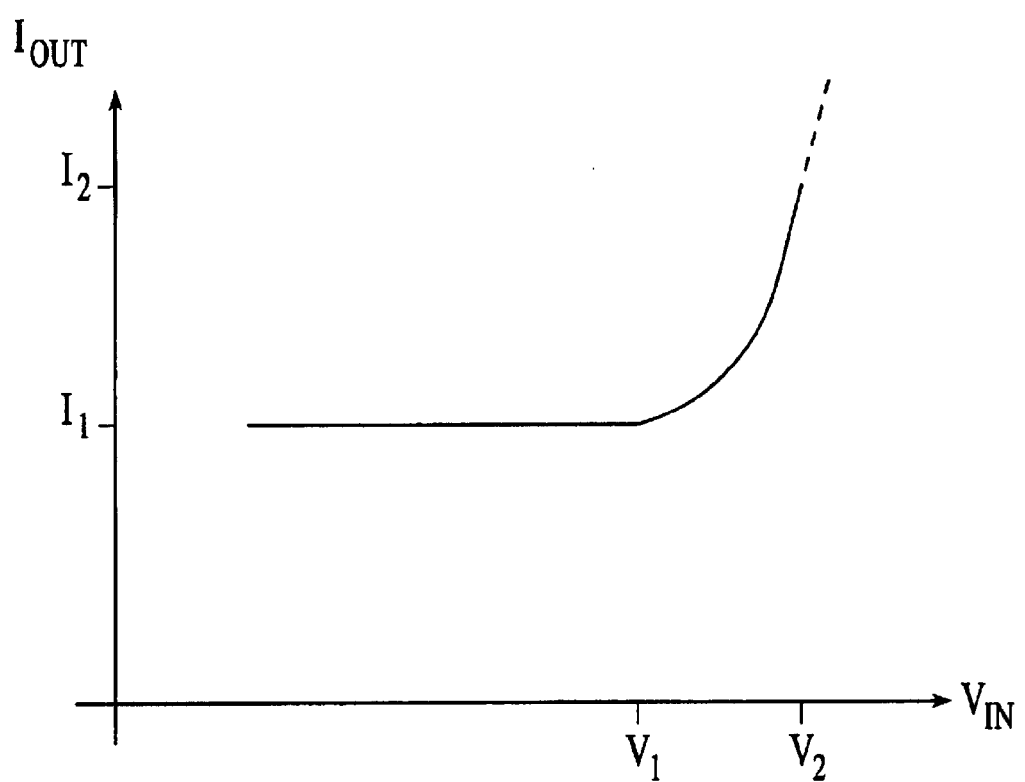
FIG. 2 illustrates $I_{out}$ vs. $V_{in}$ characteristics for the integrated power transistor of FIG. 1.

FIG. 2 illustrates $I_{out}$ vs. $V_{in}$ characteristics for the integrated power transistor 12 of FIG. 1. Up to $V_1$ input voltage $I_{out}$ is steady and has a programmed value of $I_1$. If $V_{in}>V_1$ then $I_{out}$ starts to increase. The rate of increase is accelerating as $V_{in}$ gets higher and higher. At a certain voltage, for example, the value $V_2$, $I_{out}$ can reach a level at which the device is in danger of melting down. This level is designated with $I_2$. It is important to notice that the body of power transistor 12 is grounded. This allows several drivers to be connected to the same output bus line and switch different voltages there as desired by the controller without having interaction between drivers.

Figure 3:
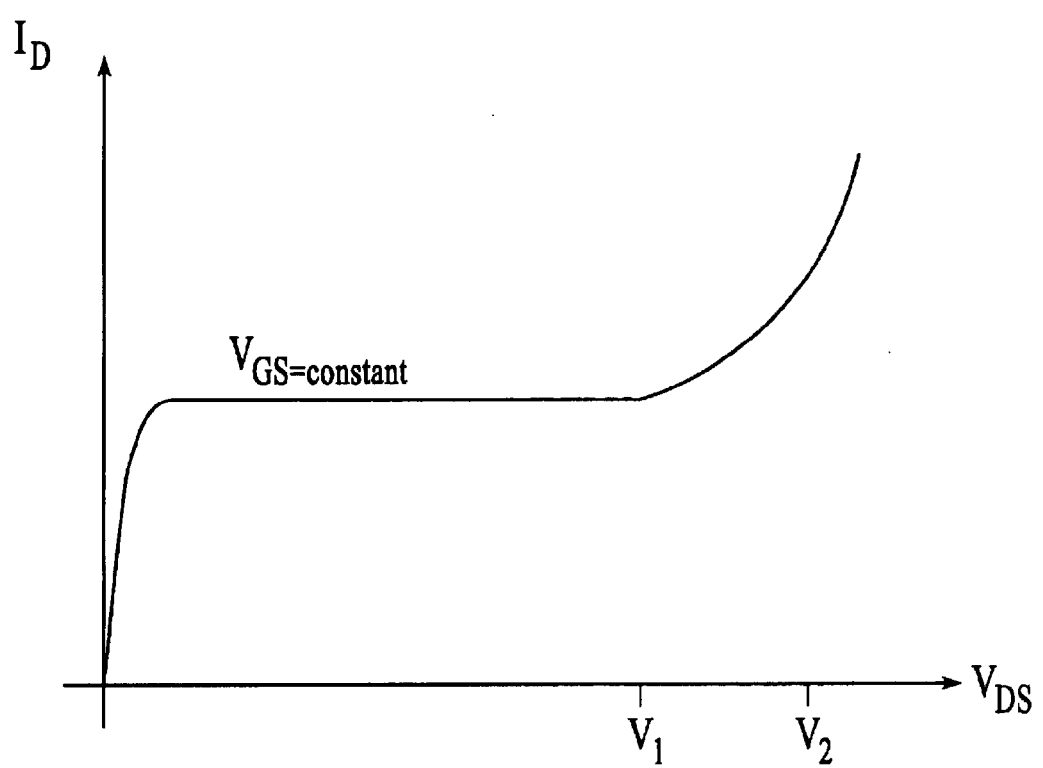
FIG. 3 illustrates the $I_d$ vs. $V_{ds}$ characteristics of the power transistor.

FIG. 3 illustrates the $I_d$ vs. $V_{ds}$ characteristics of the power transistor 12. Up to $V_1$ voltage, the transistor 12 exhibits normal transistor characteristics, i.e., the drain current is relatively constant in the saturation region. Above $V_{ds}>V_1$, the drain current starts to increase rapidly even though constant voltage was maintained on the gate. The operation of circuit described in FIG. 1 assumes that the drain current of the power transistor 12 totally depends on the gate voltage and the gate voltage only. That is not the case.

Figure 4:
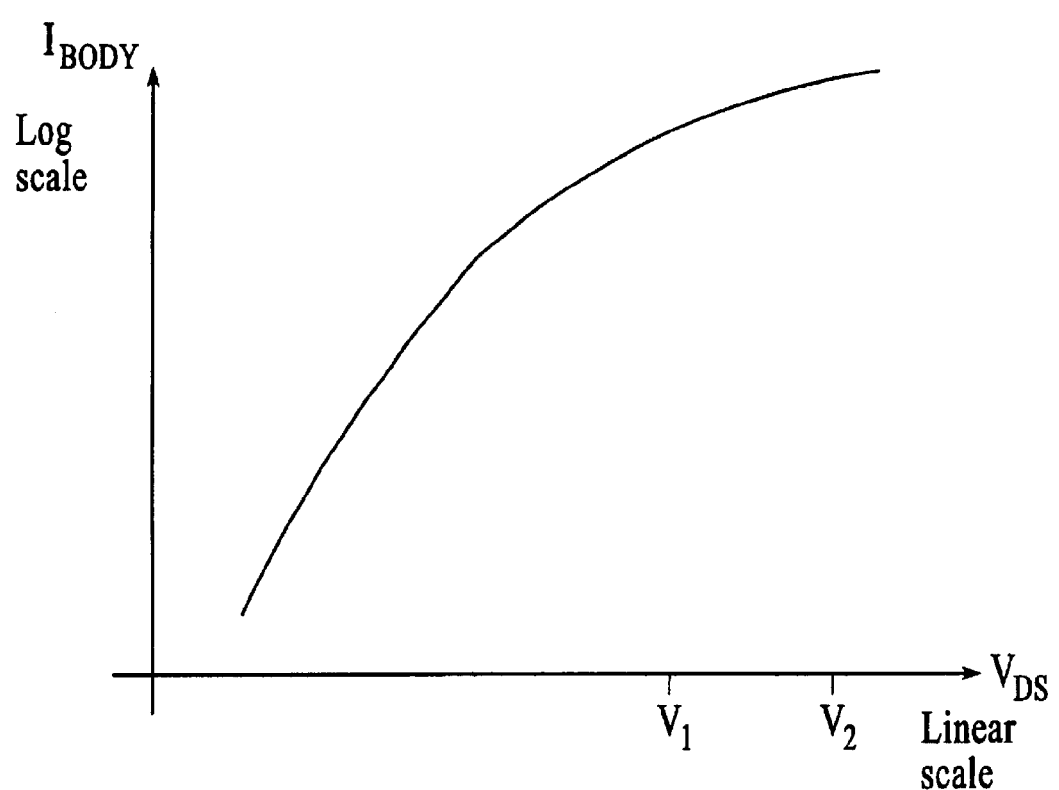
FIG. 4 illustrates the body current of the power transistor vs. $V_{ds}$.
Figure 5:
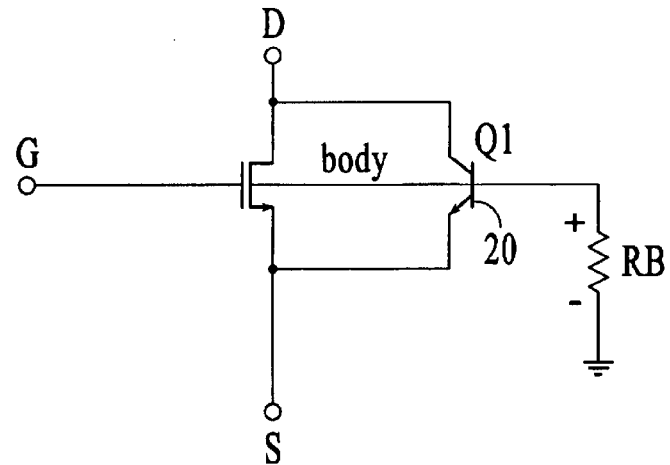
FIG. 5 shows an equivalent schematic of the power transistor.

FIG. 4 illustrates the body current of the power transistor 12 vs. $V_{ds}$. As is seen, the body current increases exponentially as $V_{ds}$ increases. The power transistor behaves as if it has a large parasitic transistor connected from drain to source and controlled by the body current. FIG. 5 shows an equivalent schematic of such a power transistor. The excess drain current, which is not under the control of the gate voltage, is caused by the following two phenomena.

1. Carrier multiplication via impact ionization in the channel region.

2. Turn on of parasitic transistor 20 between drain and source due to body current.

Figure 6:
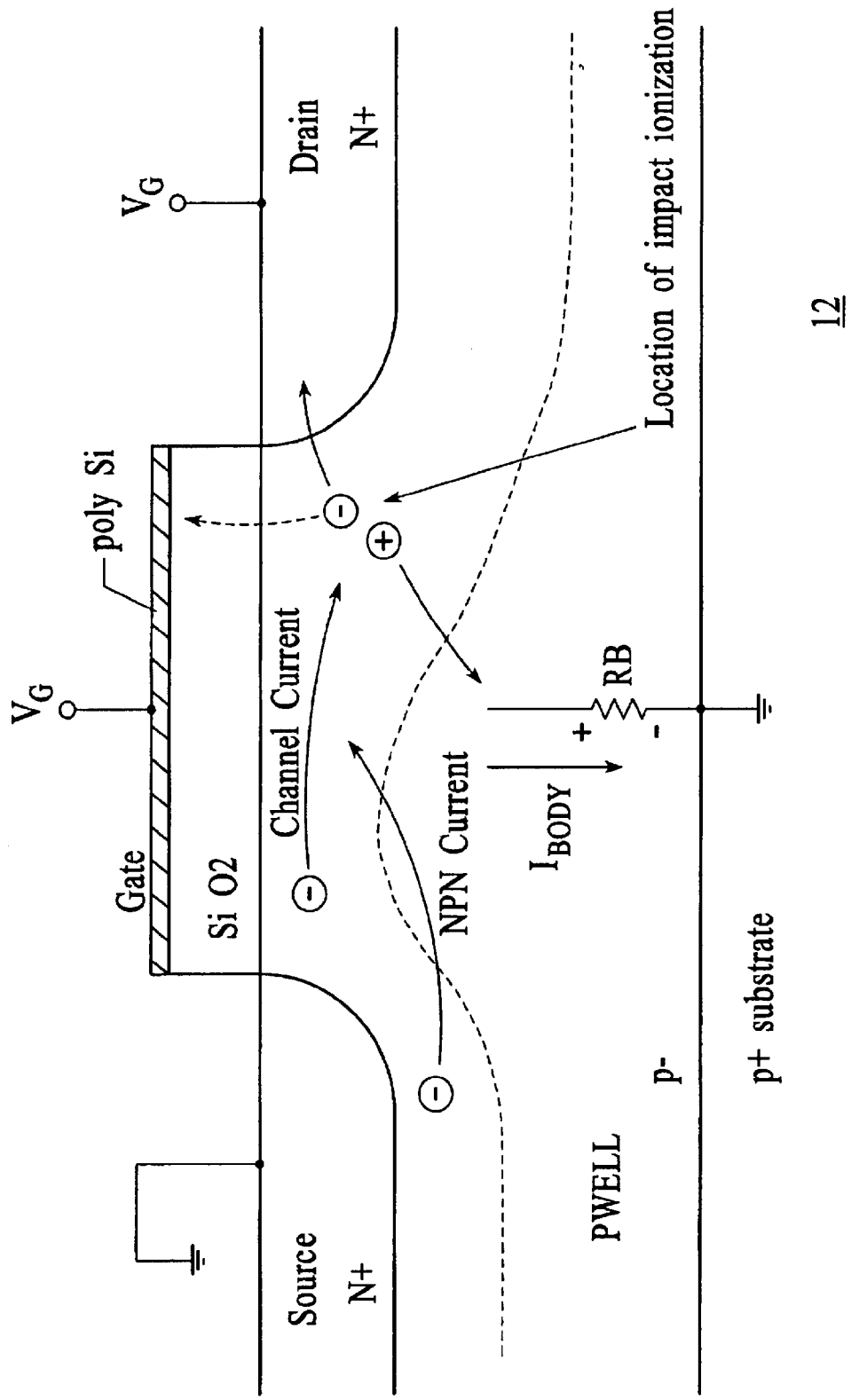
FIG. 6 shows the simplified cross section of the channel region of the power transistor under the gate.

FIG. 6 shows the simplified cross section of the channel region of the power transistor 12 under the gate. The electric field sweeps electrons from the source to the drain under the gate created by the drain voltage. Above a certain drain voltage these electrons achieve such a high speed that when they collide with the lattice they generate new hole-election pairs which are swept apart by the field immediately. The electrons rush to the drain, and a small percentage of them can get onto the gate as well. The holes are drawn to ground through the PWELL body resistance. There is a pn junction at the source and the body. If this junction is forward biased, the parasitic transistor 20 (FIG. 5) can be formed if there is a high potential N region nearby, and there is one. The drain region acts as the collector of the parasitic transistor 20. The location of impact ionization is close to the drain under the gate. The excess current generated by the impact ionization not only adds to the drain current but acts as the base current of the parasitic transistor 20. This explains the rapid increase of drain current of transistor 12 above a certain drain to source voltage and the increasing current limit of FIG. 1.

Accordingly, in a power switch in accordance with the present invention, a power transistor is implemented with grounded body and its companion sense transistor is implemented with floating body. Higher operating voltages can be achieved by turning on the parasitic transistor inside the sense transistor with a resistor connected from its body to ground. The impact ionization current of the power and sense transistors are included in the current limit loop control. The operating voltage and current range of an integrated power switch is extended by including the effect of impact ionization current in the current limit control loop. To more filly describe this feature refer now to the following discussion in conjunction with the accompanying figures.

Figure 7:
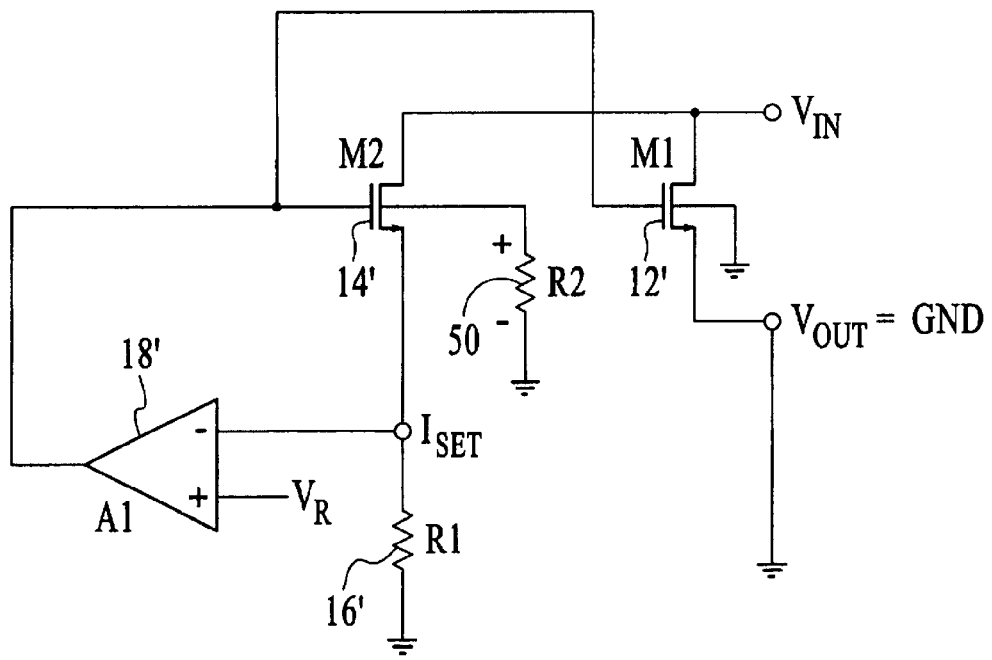
FIG. 7 is a diagram of an integrated power switch in accordance with the present invention.

FIG. 7 is a diagram of an integrated power switch 100 in accordance with the present invention. Elements that are similar to those in the power switch 10 of FIG. 1 have been given similar reference numerals to provide impact ionization current compensation in the power switch 100. The primary difference between FIG. 1 and FIG. 7 is that the body of sense transistor 14' is no longer shorted to ground. Instead, a resistor 50 is provided which is coupled to the body of transistor 14' and ground. The impact ionization and current transfer ratio of transistor 12' and transistor 14' did not change just because the body of transistor 14' is not directly grounded. To describe the use of the resistor 50 in accordance with the present invention, refer now to the following.

Figure 8:
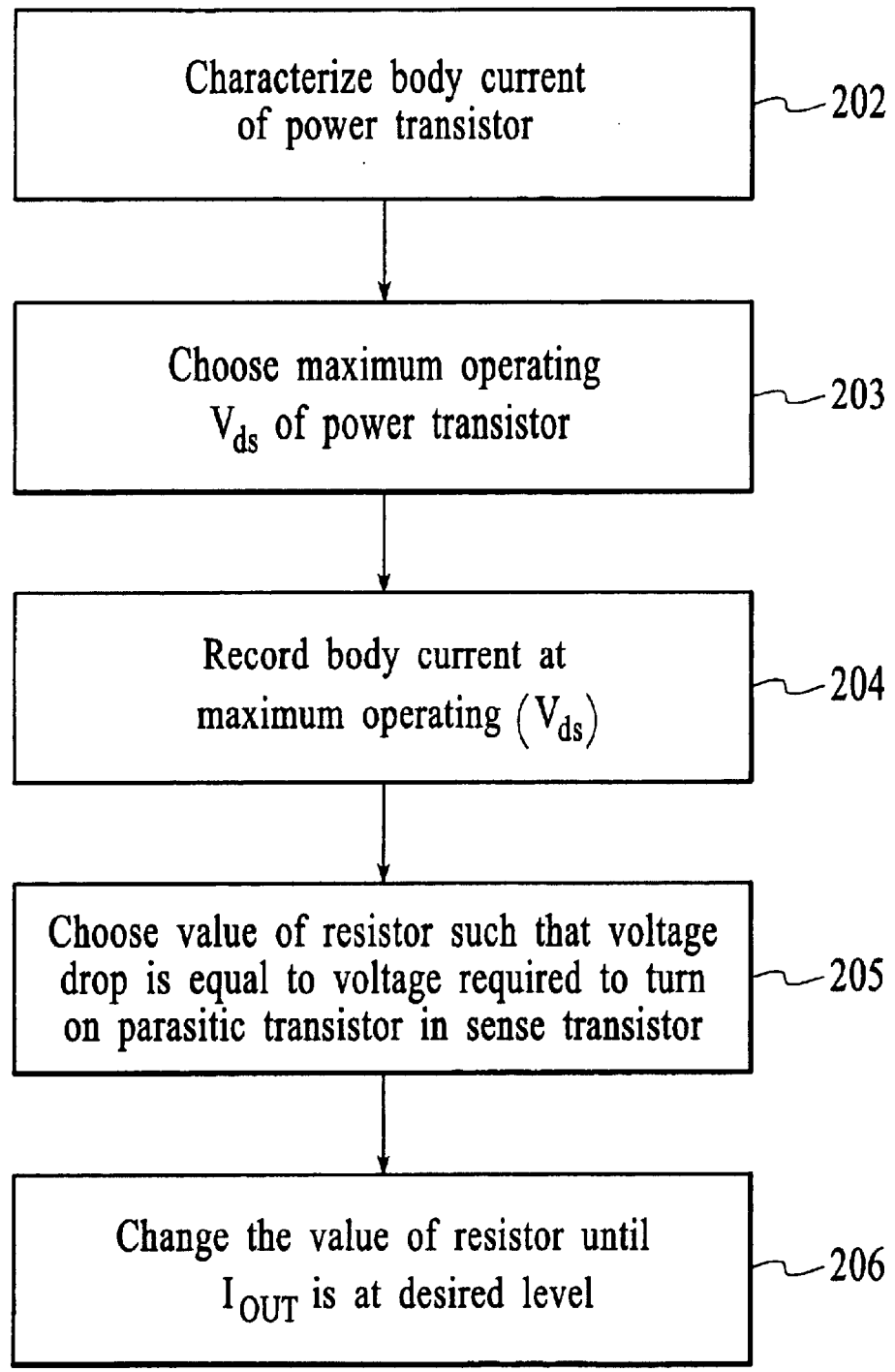
FIG. 8 is a flow chart which illustrates an impact ionization current compensation method in accordance with the present invention.

FIG. 8 is a flow chart which illustrates an impact ionization current compensation method in accordance with the present invention. Referring now to FIGS. 7 and 8 together, first the body current of power transistor 12' versus its drain to source voltage ($V_{ds}$) is characterized, via step 202. This characterization is accomplished utilizing the body current vs. $V_{ds}$ comparison, for example, shown in FIG. 4. Next, a maximum operating drain to source voltage ($V_{ds}$) of power transistor is chosen, via step 203, and the body current for the power transistor 12 is recorded at that value, via step 204. This is referred to as Ibm1. It can then be calculated that the body current of transistor 14' (Ibm2) will be equal to Ibm1/AR, where AR is the area ratio or current transfer ratio of the two transistors.

For example, by measuring the source to body pn junction of transistor 14', it is known that it takes about 650 mV to turn on the parasitic transistor inside transistor 14'. The potential at $I_{set}$ pin is therefore equal to $V_r$ in regulation.

After the maximum operating $V_{ds}$ is chosen and the body current is recorded at that value, the value of resistor 50 is chosen in such a way that the voltage drop is equal to the amount of voltage required to turn on the parasitic transistor of transistor 14' (i.e., $V_r$+650 mV) at the body current of transistor 14', via step 206. Finally, the value of resistor 50 is changed until $I_{out}$ is regulated to the desired $I_{outmax}$, via step 208.

In other words, with the help of resistor 50, the parasitic transistor is turned on inside transistor 14' intentionally and the power switch 100 is forced into regulation at lower output current. This way the current transfer ratio is reduced because the source current of transistor 14' includes the emitter current of its own parasitic transistor which is turned on by the impact ionization current. The parasitic transistor does not affect the source current of transistor 12' because the base is shorted to ground through a lower value PWELL resistor.

Advantages

Accordingly, a system and method in accordance with the present invention has the following advantages. The main power MOS transistor is implemented with grounded body and its companion sense transistor is implemented with floating body. Higher operating voltages can be achieved by turning on the parasitic transistor inside the sense transistor with a resistor connected from its body to ground. The impact ionization current of the main and sense MOS transistors is included in the current limit loop control.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An integrated power switch with current limit control comprising:

a power transistor for providing an output current wherein the power transistor includes a grounded body;

a sense transistor coupled to the power transistor, the sense transistor including a body; and a resistor coupled to the body of the sense transistor, wherein a value of the resistor is chosen such that the output current is regulated at a predetermined level, wherein the value of the resistor is chosen such that the voltage drop across the resistor is equal to the amount of voltage required to turn on a parasitic transistor within the sense transistor.

2. The integrated power switch of claim 1 wherein the resistor is coupled between the body of the sense transistor and ground.

3. The integrated power switch of claim 1 which further includes a comparator coupled to the sense transistor and a second resistor, the comparator also coupled to gates of the power transistor and the sense transistor, the comparator for providing a current limit based upon a comparison of a reference voltage and a voltage across the second resistor.

4. A method for controlling the opening range of a power switch with current limit control, the power switch including a power transistor, the power transistor including a grounded body, and a sense transistor coupled to the power transistor, the sense transistor including a body; the method comprising the steps of:

(a) characterizing the body current of the power transistor;

(a) determining a maximum operating drain to source voltage ($V_{ds}$) for the power transistor;

(c) recording the body current of the power transistor at maximum operating $V_{ds}$; and (d) choosing a value of a resistor that is coupled to the body of the sense transistor to cause a parasitic transistor to be turned on to force the power switch into regulation.

5. The method of claim 4 wherein the resistor is coupled between the body of the sense transistor and ground.

6. The method of claim 4 wherein the value of the resistor is chosen such that the voltage drop across the resistor is equal to the amount of voltage required to turn on a parasitic transistor within the sense transistor.

7. An integrated power switch with current limit control comprising:

a power transistor for providing an output current wherein the power transistor includes a grounded body;

a sense transistor coupled to the Dower transistor, the sense transistor including a body;

a first resistor coupled to the body of the sense transistor, wherein a value of the resistor is chosen such that the output current is regulated at a predetermined level, wherein the value of the first resistor is chosen such that the voltage drop across the first resistor is equal to the amount of voltage required to turn on a parasitic transistor within the sense transistor, and wherein the first resistor is coupled between the body of the sense transistor and ground; and a comparator coupled to the sense transistor and a second resistor, the comparator also coupled to gates of the power transistor and the sense transistor, the comparator for providing a current limit based upon a comparison of a reference voltage and a voltage across the second resistor.

8. An integrated power switch with current limit control comprising:

a power transistor for providing an output current wherein the power transistor includes a grounded body;

a sense transistor coupled to the power transistor, the sense transistor including a body; and a resistor coupled to the body of the sense transistor, wherein a value of the resistor is chosen such that the output current is regulated at a predetermined level, which further includes a comparator to the sense transistor and a second resistor, the comparator also coupled to the gates of the power transistor and the sense transistor, the comparator for providing a current limit based upon a comparison of a reference voltage and a voltage across the second resistor.

* * * * *